(12) United States Patent
Styonavich

(10) Patent No.: US 10,685,806 B2
(45) Date of Patent: Jun. 16, 2020

(54) IMAGE INTENSIFIER BLOOM MITIGATION

(71) Applicant: Stephen Styonavich, Tempe, AZ (US)

(72) Inventor: Stephen Styonavich, Tempe, AZ (US)

(73) Assignee: L-3 COMMUNICATIONS CORPORATION-INSIGHT TECHNOLOGY DIVISION, Tempe, AZ (US)

( * ) Notice: Subject to any disclaimer, the term of this patent is extended or adjusted under 35 U.S.C. 154(b) by 263 days.

(21) Appl. No.: 15/294,232

(22) Filed: Oct. 14, 2016

(65) Prior Publication Data

US 2018/0108509 A1  Apr. 19, 2018

(51) Int. Cl.
| | |
|---|---|
| H01J 40/14 | (2006.01) |
| H01J 31/50 | (2006.01) |
| H01L 27/148 | (2006.01) |
| H01J 29/02 | (2006.01) |
| H01J 29/18 | (2006.01) |
| H01J 9/18 | (2006.01) |

(52) U.S. Cl.
CPC ........... *H01J 31/506* (2013.01); *H01J 9/18* (2013.01); *H01J 29/023* (2013.01); *H01J 29/18* (2013.01); *H01L 27/14887* (2013.01); *H01J 2209/012* (2013.01); *H01J 2231/50015* (2013.01); *H01J 2231/5016* (2013.01); *H01J 2231/50063* (2013.01)

(58) Field of Classification Search
CPC ........ H01J 31/506; H01J 29/023; H01J 29/18; H01J 9/18; H01L 27/14887

USPC .......................................................... 250/207
See application file for complete search history.

(56) References Cited

U.S. PATENT DOCUMENTS

| | | | | |
|---|---|---|---|---|
| 3,742,224 A * | 6/1973 | Einstein | ................ | H01J 31/507 250/214 VT |
| 4,691,099 A * | 9/1987 | Johnson | ................ | H01J 43/246 250/214 VT |
| 5,127,080 A * | 6/1992 | Duggan, Sr. | ............. | G02B 6/08 385/116 |
| 5,159,231 A * | 10/1992 | Feller | .................... | H01J 43/246 250/207 |
| 6,040,000 A * | 3/2000 | Floryan | ................. | C23C 14/042 427/126.1 |
| 6,396,049 B1 * | 5/2002 | Estrera | .................. | H01J 43/246 250/214 VT |

(Continued)

*Primary Examiner* — Seung C Sohn
*Assistant Examiner* — Kevin Wyatt
(74) *Attorney, Agent, or Firm* — Grossman, Tucker, Perreault & Pfleger, PLLC

(57) ABSTRACT

Image intensifiers may include a photocathode that emits photoelectrons in proportion to the rate photons impact the photocathode. The photoelectrons are multiplied using a microchannel plate that includes a plurality of microchannels. Photoelectrons are scattered by the microchannel plate when the photoelectrons strike the surface of the microchannel plate rather than enter one of the microchannels. Electron scatter within an image intensifier results in a halo or bloom around bright or luminous objects. Halo or bloom may be minimized by reducing the electron scatter within the image intensifier. Deposition of an anti-scattering layer on the surface of the microchannel plate within the image intensifier can absorb photoelectrons that fail to enter a microchannel and may thus reduce the incidence of halo or bloom.

26 Claims, 10 Drawing Sheets

(56) References Cited

U.S. PATENT DOCUMENTS

| | | | |
|---|---|---|---|
| 2003/0180449 A1* | 9/2003 | Wiktorowicz | B01F 5/0256 506/40 |
| 2005/0122021 A1* | 6/2005 | Smith | H01J 29/085 313/103 CM |
| 2007/0267567 A1* | 11/2007 | Filipovich | G02B 23/125 250/214 VT |
| 2009/0315443 A1* | 12/2009 | Sullivan | H01J 43/246 313/103 CM |
| 2010/0025796 A1* | 2/2010 | Dabiran | C23C 16/403 257/436 |
| 2018/0304252 A1* | 10/2018 | Wei | B01L 3/5027 |

* cited by examiner

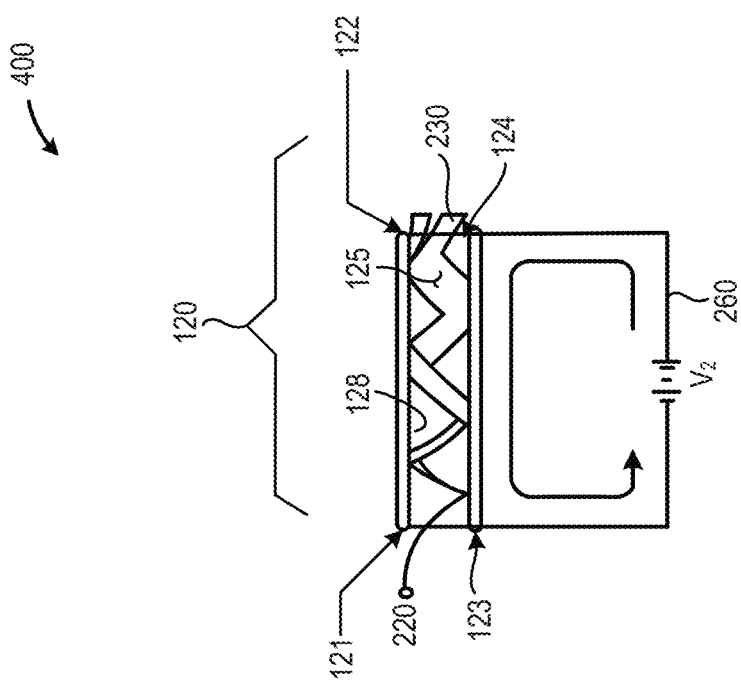
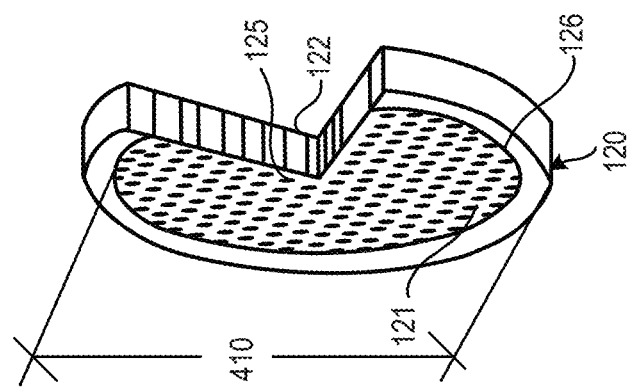
FIG. 4B
FIG. 4A

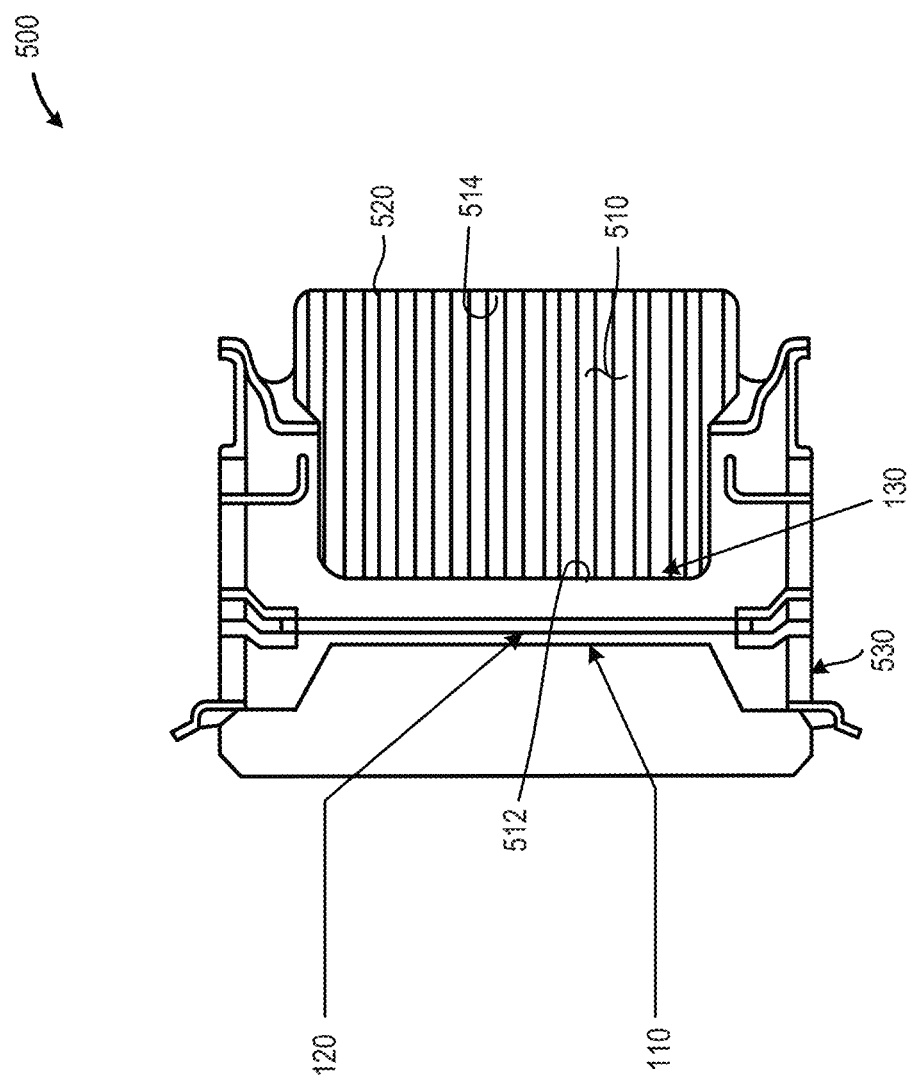

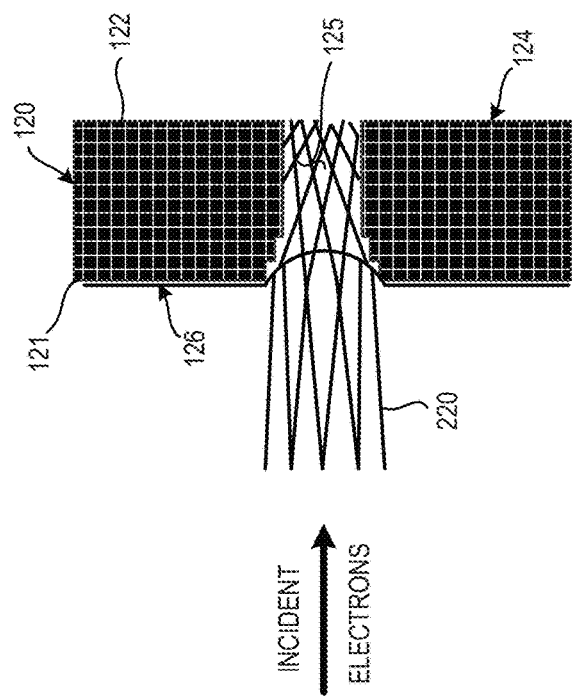
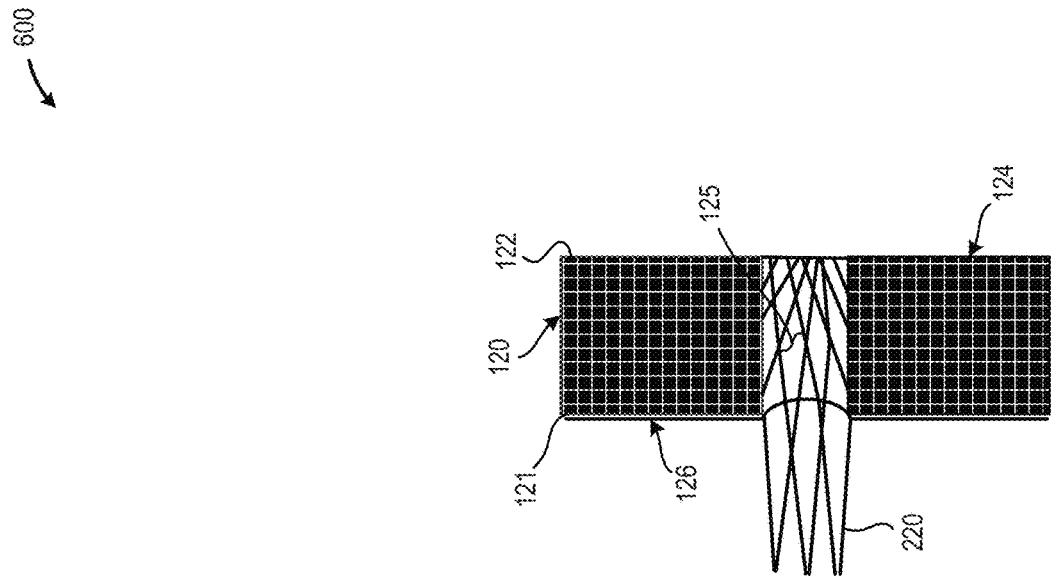
FIG. 6A
FIG. 6B

IMAGE INTENSIFIER BLOOM MITIGATION

TECHNICAL FIELD

The present disclosure relates to image intensifier performance enhancements.

BACKGROUND

An image intensifier is a vacuum tube device that enables a user to see in low light and very-low ambient light conditions by increasing the intensity of ambient available light. Photons entering an image intensifier are converted to electrons using a photocathode which are multiplied prior to striking a phosphor screen to create a human-visible image. "Bloom" is a haloing effect that occurs around intense light sources when viewed through an image intensifier. Since the photocathode generates photoelectrons in proportion to the photon incidence rate on the photocathode, small, intensely luminous, light producing devices, such as streetlights, tend to create a large number of photoelectrons, at least some of which are scattered across the microchannel plate during the electron multiplication process. This scattering produces "bloom," an outwardly extending halo about the intense light source that is visible in the image created on the phosphor screen and presented to the image intensifier user. This "bloom" may compromise the ability of the image intensifier user to view persons or objects located proximate an intense light source, potentially exposing the image intensifier user to dangerous conditions.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 4A provides a perspective sectional view of an illustrative microchannel plate, in accordance with at least one embodiment described herein;

FIG. 4B provides a cross-sectional view of an illustrative microchannel such as those found in the illustrative microchannel plate depicted in FIG. 4A, in accordance with at least one embodiment described herein;

FIG. 5 provides a cross-sectional view of an illustrative image intensifier in which a first end of a fiber optic bundle is disposed proximate the visible output device and a second end of the fiber optic bundle is disposed proximate an output window, in accordance with at least one embodiment described herein;

FIG. 6A provides a cross-sectional view of an illustrative microchannel that includes a funnel-shaped entrance, in accordance with at least one embodiment described herein;

FIG. 6B provides a cross-sectional view of an illustrative microchannel that includes a square-edged entrance, in accordance with at least one embodiment described herein;

Figure 1:
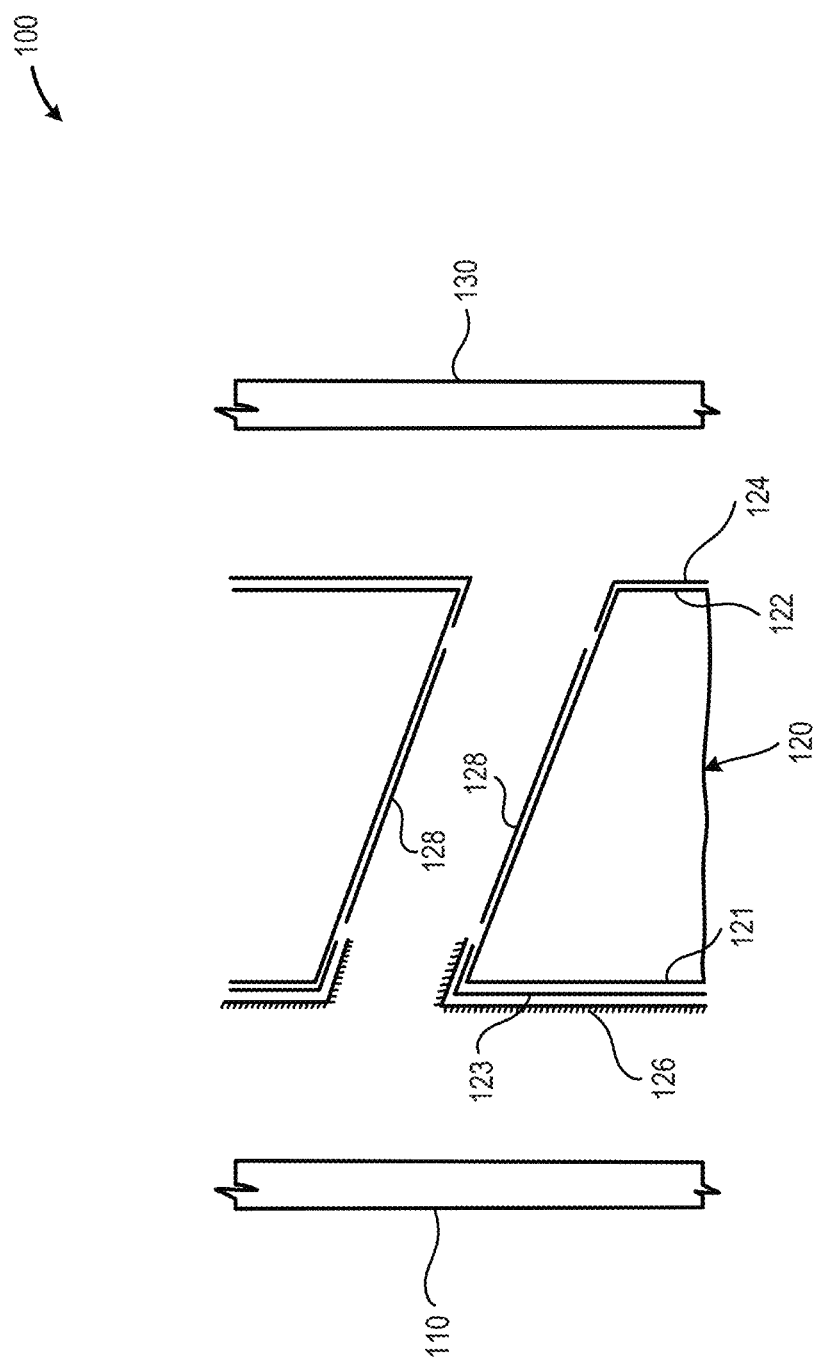
FIG. 1 provides a cross-sectional view of a portion of an illustrative image intensifier, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein reduce the incidence and/or intensity of bloom or haloing effects that occur when an intense light source falls within the field-of-view of an image intensifier. An image intensifier includes a photocathode that converts incident photons to electrons, a microchannel plate that multiplies the electrons provided by the photocathode, and a phosphor screen that receives the multiplied electrons and generates an image in the visible electromagnetic spectrum that may be viewed by a system user. Generally, the more intense the light source, the greater the photon emission rate of the source. Since the electron generation rate of the photocathode is proportional to the incident photon rate, intense light sources cause a relatively small portion of the photocathode to generate a relatively large number of electrons. At least some of these large number of generated electrons scatter off the surface of the microchannel plate and enter microchannels adjacent the location corresponding to the incident location of the photons. The scattered electrons entering adjacent microchannels cause the phenomenon known as "bloom" or "halo" around intense light sources when viewed through an image intensifier.

The systems and methods described herein include an anti-scattering layer deposited on the surface of the microchannel plate and extending partially into the microchannels to reduce the scattering of electrons from the surface of the microchannel plate. The microchannel plate includes a first, input, surface and a second, exit, surface fluidly coupled via a plurality of microchannels that extend from the first surface to the second surface. The anti-scattering layer on the first, input, surface may include one or more low-Z (i.e., low atomic number, high work function surface) materials deposited in a prescribed manner across the surface of the microchannel plate. The low-Z layer may extend at least partially into the microchannels. In addition, the anti-scattering layer may include an extended surface area such as structures extending from the first surface of the microchannel plate.

The anti-scattering layer captures a portion of the electrons that fail to enter a microchannel instead of allowing them to scatter from the first surface of the microchannel plate. By capturing at least some of the electrons that fail to enter a microchannel, the anti-scattering layer minimizes the propagation of the electrons to nearby microchannels, thereby reducing the bloom or halo visible to the system user.

A reduced bloom effect image intensifier is provided. The image intensifier may include: a photocathode; a phosphor screen; a microchannel plate disposed between the photocathode and the phosphor screen, the microchannel plate having a first surface oriented toward the photocathode, a transversely opposed second surface oriented toward the phosphor screen, and a plurality of microchannels fluidly coupling the first surface and the second surface, the microchannel plate including: an anti-scattering layer, the anti-scattering layer deposited across at least a portion of the first surface and extending a distance into each of the plurality of microchannels, wherein the anti-scattering layer includes at least one low-Z material.

A method of reducing bloom effect in an image intensifier is provided. The method may include generating electrons proportionate to incoming photon intensity via a photocathode; applying a voltage bias across a microchannel plate that includes a plurality of microchannels using a first electrode disposed on a first surface of the microchannel plate and a second electrode disposed on a second surface of the microchannel plate, the second surface transversely opposed to the first surface; causing the electrons generated by the photocathode to travel toward the first surface of the microchannel plate; and absorbing, via an anti-scattering layer disposed on at least a portion of the first surface of the microchannel plate, a portion of the generated electrons that fail to enter one of the plurality of microchannels and impinge upon the anti-scattering layer.

A method of manufacturing reduced bloom effect image intensifier is provided. The method may include: depositing an anti-scattering layer that includes at least one low-Z material on at least a portion of a first surface of a microchannel plate, the microchannel plate including a plurality of microchannels fluidly coupling the first surface to a transversely opposed second surface, the anti-scattering layer to absorb at least a portion of electrons incident upon the first surface.

A system for reducing bloom effect in an image intensifier is provided. The system may include: a means for generating electrons proportionate to incoming photon intensity; a means for applying a voltage bias across a microchannel plate that includes a plurality of microchannels using a first electrode disposed on a first surface of the microchannel plate and a second electrode disposed on a second surface of the microchannel plate, the second surface transversely opposed to the first surface; a means for causing the generated electrons to travel toward the first surface of the microchannel plate; and a means for absorbing a portion of the generated electrons that fail to enter one of the plurality of microchannels and impinge upon the first surface of the microchannel plate.

A system of manufacturing a reduced bloom effect image intensifier is provided. The system may include: a means for depositing an anti-scattering layer that includes at least one low-Z material on at least a portion of a first surface of a microchannel plate, the microchannel plate including a plurality of microchannels fluidly coupling the first surface to a transversely opposed second surface, the anti-scattering layer to absorb at least a portion of electrons incident upon the first surface.

FIG. 1 provides a cross-sectional view of a portion of an illustrative image intensifier 100, in accordance with at least one embodiment described herein. Visible in FIG. 1 are a photocathode 110 that converts incoming photons to photoelectrons, a microchannel plate 120 that multiplies the photoelectrons, and a visible output device 130 that converts incident multiplied photoelectrons to a visible image. The microchannel plate 120 includes a member having a first surface 121 and a transversely opposed second surface 122. Although only one microchannel is visible in FIG. 1, a plurality of microchannels 125 fluidly couple the first surface 121 to the second surface 122. A first electrode 123 is disposed proximate the first surface 121 of the microchannel plate 120. A second electrode 124 is disposed proximate the second surface 122 of the microchannel plate 120. An anti-scattering layer 126 may be disposed across at least a portion of the first electrode 123 and/or the first surface 121 of the microchannel plate 120. In at least some implementations, the anti-scattering layer 126 may extend at least partially into some or all of the microchannels 125. A high secondary emission surface 128 may be disposed within each of the microchannels 125.

The photocathode 110 may include one or more charged electrodes coated with a photosensitive compound that, when struck by a photon causes the emission of a photoelectron via the photoelectric effect. The photocathode 110 may include a generally planar structure.

The photocathode 110 may include one or more semiconductor materials such as gallium arsenide (GaAs) mounted on a transparent substrate. The transparent substrate may include, but is not limited to, glass, fiber optics, or similarly transparent materials. Electrons emitted from the photocathode 110 are accelerated through an electric field toward the microchannel plate 120.

In embodiments, the microchannel plate 120 may include a thin glass wafer formed from a plurality of hollow fibers, each oriented slightly off-axis with respect to the photoelectrons emitted by the photocathode 110. In some implementations, each of the plurality of microchannels 125 may be disposed normal (i.e. at 90°) to the first surface 121 and/or the second surface 122. In some implementations, each of the plurality of microchannels 125 may be disposed at a non-normal (i.e., an angle of other than 90°) measured with respect to the first surface 121 and/or the second surface 122.

In some implementations, each of the microchannels 125 may have a constant cross-sectional area. In other implementations, some or all of the microchannels 125 may have a variable cross-sectional area. For example, in some implementations, some or all of the plurality of microchannels 125 may have a funnel shaped cross section proximate the first surface 121 and/or the second surface 122. Each of the plurality of microchannels 125 may have the same or different inside diameters. In some implementations each of the plurality of microchannels 125 may have the same inside diameter. For example, each of the plurality of microchannels 125 may have an inside diameter of: about 2 micrometers (μm) or less; about 3 μm or less; about 5 μm or less; about 7 μm or less; or about 10 μm or less. The plurality of microchannels 125 may be arranged on a regular pitch pattern such as a triangular pitch or square pitch pattern. The pitch distance between each of the plurality of microchannels 125 may be the same or different. In some implementations, the pitch distance between each of the plurality of microchannels 125 may be the same. For example, the pitch distance between each of the plurality of microchannels 125 may be about 3 micrometers (μm) or less; about 5 μm or less; about 7 μm or less; about 10 μm or less; or about 15 μm or less.

The first electrode 123 may be disposed in, on, or about the first surface 121 of the microchannel plate 120. In embodiments, when operating, a potential difference may exist between the photocathode 110 and the first electrode 123. In some implementations, the first electrode 123 may extend at least partially into some or all of the microchannels 125.

The second electrode 124 may be disposed in, on, or about the second surface 122 of the microchannel plate 120. In some implementations, the second electrode 124 may extend at least partially into some or all of the microchannels 125. The first electrode 123 and the second electrode 124 may be used to apply a bias voltage across the microchannel plate 120 to accelerate the electrons generated by the high secondary emission surface 128 disposed on the interior surface of some or all of the microchannels 125.

Anti-scattering layer 126 may be disposed in, on, or about all or a portion of the first surface 121 of the microchannel plate 120 and/or the first electrode 123. In some implementations, the anti-scattering layer 126 may extend at least partially into some or all of the microchannels 125. The anti-scattering layer 126 may include one or more materials capable of absorbing or otherwise attenuating the energy of photoelectrons striking the first surface 121 and/or first electrode 123. Example anti-scattering layer materials include, but are not limited to, boron, nickel, chrome, copper, titanium, boron carbides, nickel carbides, chrome carbides, copper carbides, titanium carbides, boron oxides, nickel oxides, chrome oxides, copper oxides, titanium oxides, boron containing alloys, nickel containing alloys, chrome containing alloys, copper containing alloys, titanium containing alloys, or combinations thereof.

The anti-scattering layer 126 may include an extended surface area, for example by including structures extending outward from the first surface 121. In some implementations, such extended surface structures may extend from the first surface at one or more angles. In some implementations, the anti-scattering layer 126 may include low-density, aligned, columnar structures that extend at an angle from the first surface 121 and/or the first electrode 123. In some implementations, the anti-scattering layer 126 may include dendritic or tree-like structures extending at an angle from the first surface 121 and/or the first electrode 123. The anti-scattering layer 126 may be deposited in, on, or about the first surface 121 and/or the first electrode 123 at a uniform or non-uniform thickness. In some implementations, the anti-scattering layer 126 may have a thickness, including the height of the extended surface area (if present), of: about 1000 nanometers (nm) or less; about 700 nm or less; about 500 nm or less; about 300 nm or less; about 150 nm or less; about 100 nm or less; about 50 nm or less; about 200 nm or less; or about 10 nm or less. The anti-scattering layer 126 may be deposited in, on, or about all or a portion of the first surface 121 and/or the first electrode 123 using any currently available or future developed deposition techniques. Example physical vapor deposition techniques include, but are not limited to, ion assist, electron beam, laser ablation, sputtering, or resistance evaporation.

The visible output device 130 may include any currently available or future developed device, system, or combination of systems and/or devices capable of providing a visible light output in response to electrons exiting from the microchannel plate 120. In embodiments, the visible output device 130 may function as an anode with respect to the photocathode 110. In some implementations, the visible output device 130 may include a phosphor screen. In some implementations, the visible output device 130 may include a charge coupled device (CCD). The visible output device 130 may be maintained at a potential such that electrons exiting the microchannel plate 120 are accelerated toward the visible output device 130.

Figure 2A:
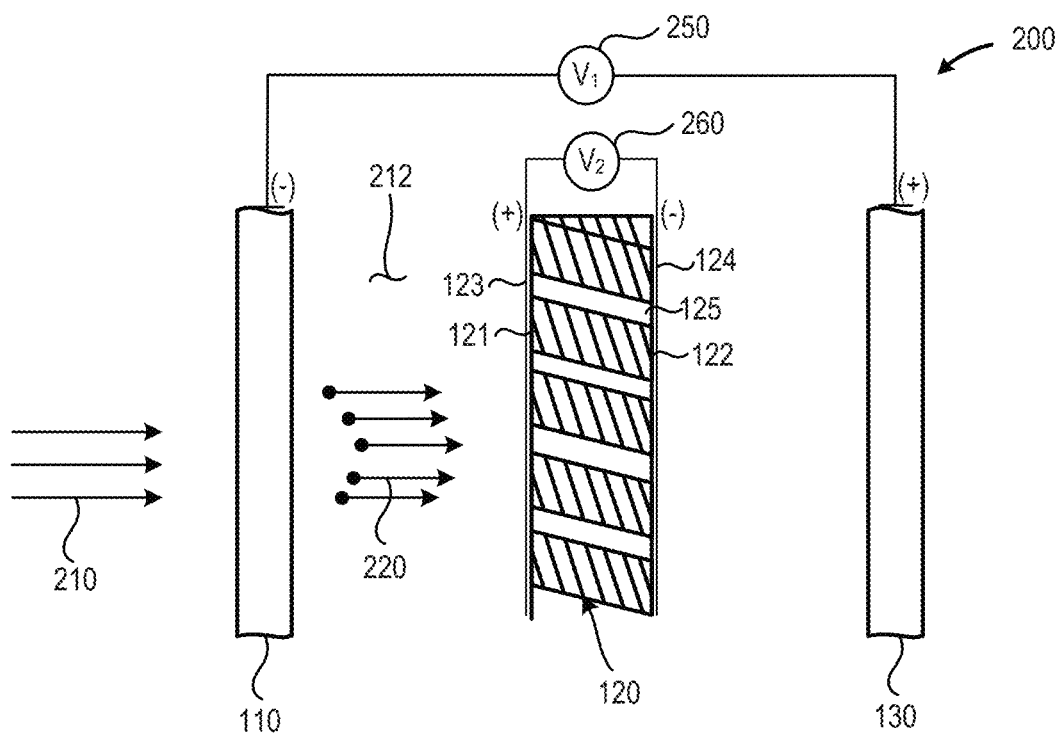
FIG. 2A provides a cross-sectional view of an illustrative image intensifier in which incoming photons cause the photocathode to emit photoelectrons, in accordance with at least one embodiment described herein.

FIG. 2A provides a cross-sectional view of an illustrative image intensifier 200 in which incoming photons 210 cause the photocathode 110 to emit photoelectrons 220, in accordance with at least one embodiment described herein. As depicted in FIG. 2A, electromagnetic energy in the form of photons 210 generated by and/or reflected from a scene within the field-of-view of the image intensifier 200A may fall incident upon the photocathode 110. The photocathode 110 may be maintained at a voltage differential from the visible output device 130 using first voltage source 250. In some implementations, the photocathode 110 may be maintained at a negative voltage bias with respect to the visible output device 130.

The incident photons 210 cause the photocathode 110 to emit photoelectrons 220. The rate of photoelectron generation and/or emission may be proportional to the intensity or brightness (i.e., the rate of photon 210 generation) of the object appearing in the field-of-view of the image intensifier 200. The voltage bias between the photocathode 110 and the first electrode 123 on the first surface 121 of the microchannel plate 120 creates an electric field 212 in the vacuum between the photocathode 110 and the microchannel plate 120. The electric field 212 accelerates the photoelectrons 220 toward the first surface 121 of the microchannel plate 120.

Figure 2B:
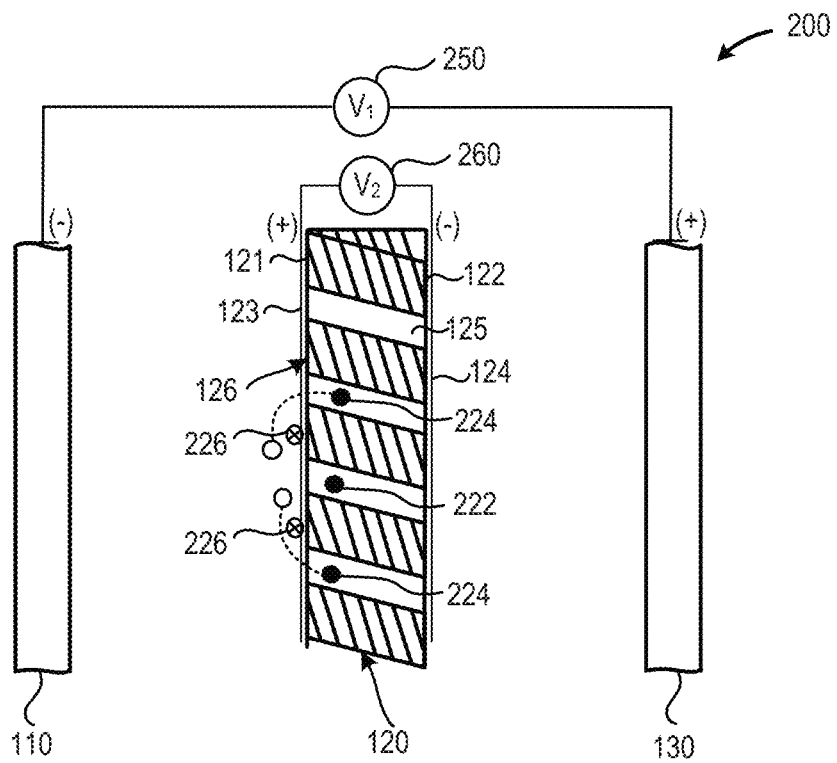
FIG. 2B provides a cross-sectional view of the illustrative image intensifier depicted in FIG. 2A, in which a portion of the photoelectrons have entered one or more microchannels on the microchannel plate and a portion of the photoelectrons have not entered microchannels and have instead impacted the first surface of the microchannel plate, in accordance with at least one embodiment described herein.

FIG. 2B provides a cross-sectional view of the illustrative image intensifier 200 depicted in FIG. 2A, in which a portion of the photoelectrons 220 have entered one or more microchannels 125 on the microchannel plate 120 and a portion 226 of the photoelectrons 220 have not entered microchannels 125 and have instead impacted the first surface 121 of the microchannel plate 120, in accordance with at least one embodiment described herein. As depicted in FIG. 2B, a first portion of the photoelectrons 222 emitted by the photocathode 110 may enter one or more microchannels 125. However, some or all of the remaining portion 226 of the photoelectrons 220 may "miss" a microchannel 125 and may instead strike the first surface 121 of the microchannel plate 120.

A second voltage source 260 may be conductively coupled to the first electrode 123 and the second electrode 124. In operation, the second voltage source may maintain a voltage bias across the microchannel plate 120. The presence of the voltage bias across the microchannel plate 120 causes further acceleration of the photoelectrons 222 through the microchannels 125. As the photoelectrons 222 strike the high secondary emission surface 128 within the microchannels 125, additional electrons are generated and emitted. The spontaneous emission of electrons within the microchannel may cause the generation and emission of yet more electrons, providing a cascade or avalanche multiplication effect through the microchannel plate 120. In some implementations, the microchannel plate may provide an electron multiplication factor of about 100 or more; about 500 or more; about 1,000 or more; about 2,000 or more; about 5,000 or more; about 7,500 or more; or about 10,000 or more.

In the absence of the anti-scattering layer 126 described in detail with regard to FIG. 1, the photoelectrons striking the first surface 121 of the microchannel plate 120 may cause scattering of additional electrons 124 that may be drawn into nearby microchannels 125. These scattered electrons entering nearby microchannels 125 produce the visible "halo" or "bloom" effect. The deposition of the anti-scattering layer 126 on the first surface 121 and/or the first electrode 123 beneficially reduces the incidence of electron scattering by absorbing 226 either (or both) the stray photoelectrons 220 that strike the first surface 121 and/or the scattered electrons 224 generated when the stray photoelectrons 220 strike the first surface 121. Reducing or eliminating the scattered electrons 224 advantageously mitigates or may even eliminate the occurrence of a visible halo or bloom about a bright or highly luminous object. Reducing or eliminating the halo or bloom about a bright object benefits the user of the image intensifier by permitting the user to see objects or persons proximate the bright or highly luminous object.

Figure 2C:
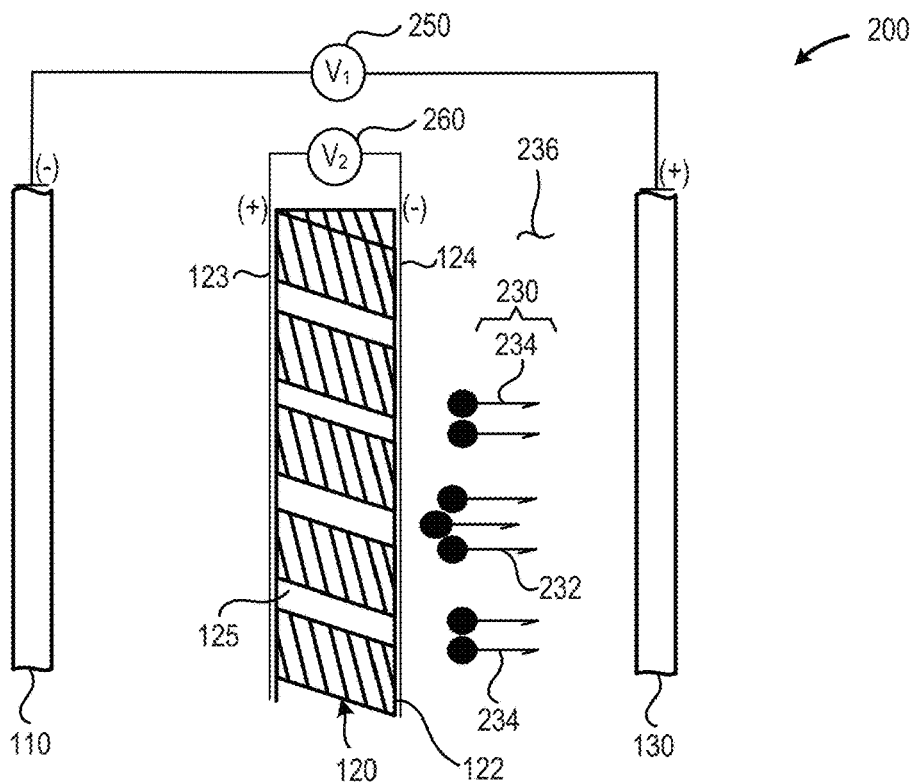
FIG. 2C provides a cross-sectional view of the illustrative image intensifier depicted in FIGS. 2A and 2B, in which the photoelectrons entering the microchannels have been multiplied by the microchannel plate to produce a greater number of electrons which exit the microchannel plate, in accordance with at least one embodiment described herein.

FIG. 2C provides a cross-sectional view of the illustrative image intensifier 200 depicted in FIGS. 2A and 2B, in which the photoelectrons 220 entering the microchannels 125 have been multiplied by the microchannel plate 120 to produce a greater number of electrons 230 which exit the microchannel plate 120, in accordance with at least one embodiment described herein. As depicted in FIG. 2C, a relatively large number of emitted electrons 232 exit the microchannel(s) 125 corresponding to the location on the photocathode 110 where the bright or luminous object was positioned. In some implementations, a voltage bias may exist between the second electrode 124 and the visible output device 130. The voltage differential between the second electrode 124 and the visible output device 130 may create an electric field 236 that causes the emitted electrons 230 to accelerate toward the visible output device 130.

In the absence of the anti-scattering layer 126, additional emitted electrons 234 may exit other, proximate, microchannels 125. These emitted electrons 234 cause the halo or bloom effect that surrounds the bright or luminous object on the visible output device 130. The presence of the anti-scattering layer 126 beneficially minimizes the scattering of photoelectrons 224 thereby reducing or even eliminating the incidence of emitted electrons 234 that contribute to the halo or bloom in the image visible to the user.

Figure 2D:
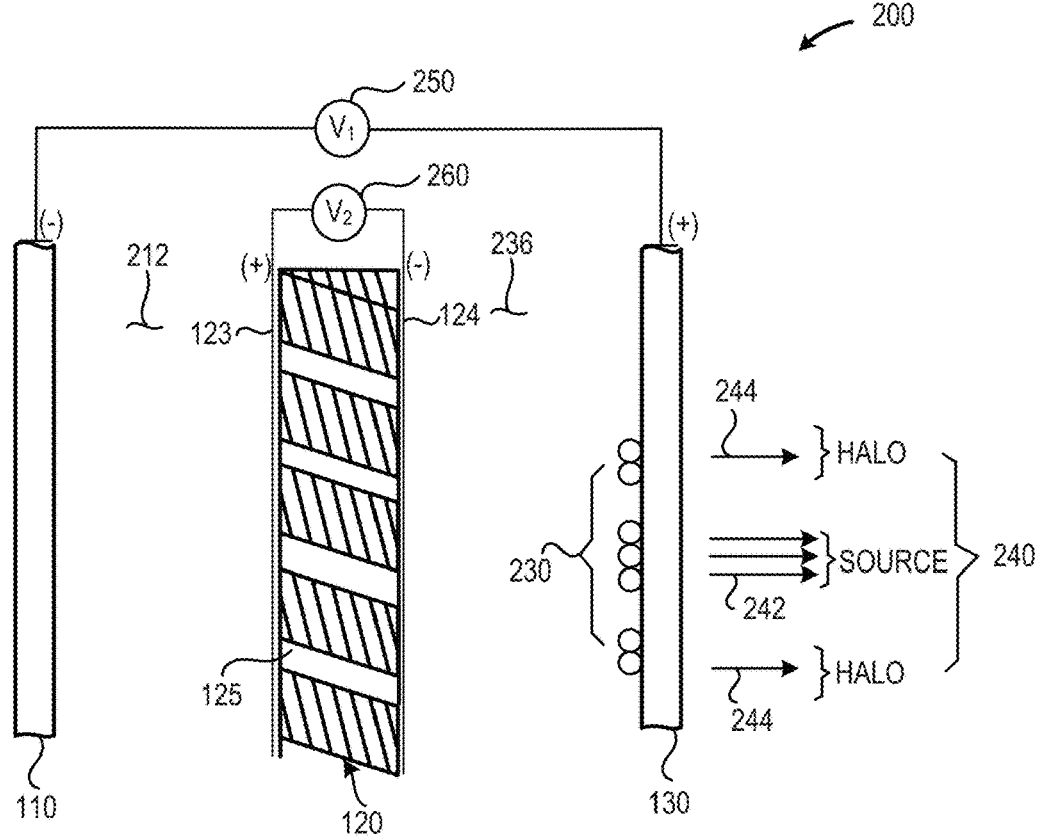
FIG. 2D provides a cross-sectional view of the illustrative image intensifier depicted in FIGS. 2A, 2B, and 2C in which the electrons emitted by the microchannel plate impact the visible output device, thereby creating a visible image, in accordance with at least one embodiment described herein.

FIG. 2D provides a cross-sectional view of the illustrative image intensifier 200 depicted in FIGS. 2A, 2B, and 2C in which the electrons emitted by the microchannel plate 120 impact the visible output device 130, thereby creating a visible image 240, in accordance with at least one embodiment described herein. As depicted in FIG. 2D, in instances where the anti-scattering layer 126 is not present, the emitted electrons 234 caused by scattered photoelectrons 224 may create a halo 244 about the image of the bright or luminous object 242. In instances where the anti-scattering layer 126 is present, the incidence of scattered photoelectrons 224 may be reduced or eliminated, thereby reducing or eliminating the electrons 234 emitted by the microchannel plate 120. Minimizing or eliminating the electrons 234 emitted by the microchannel plate 120 as a result of the scattered photoelectrons 124 may reduce or even eliminate the presence of the bloom or halo 244 about the bright or luminous object 242.

Figure 3:
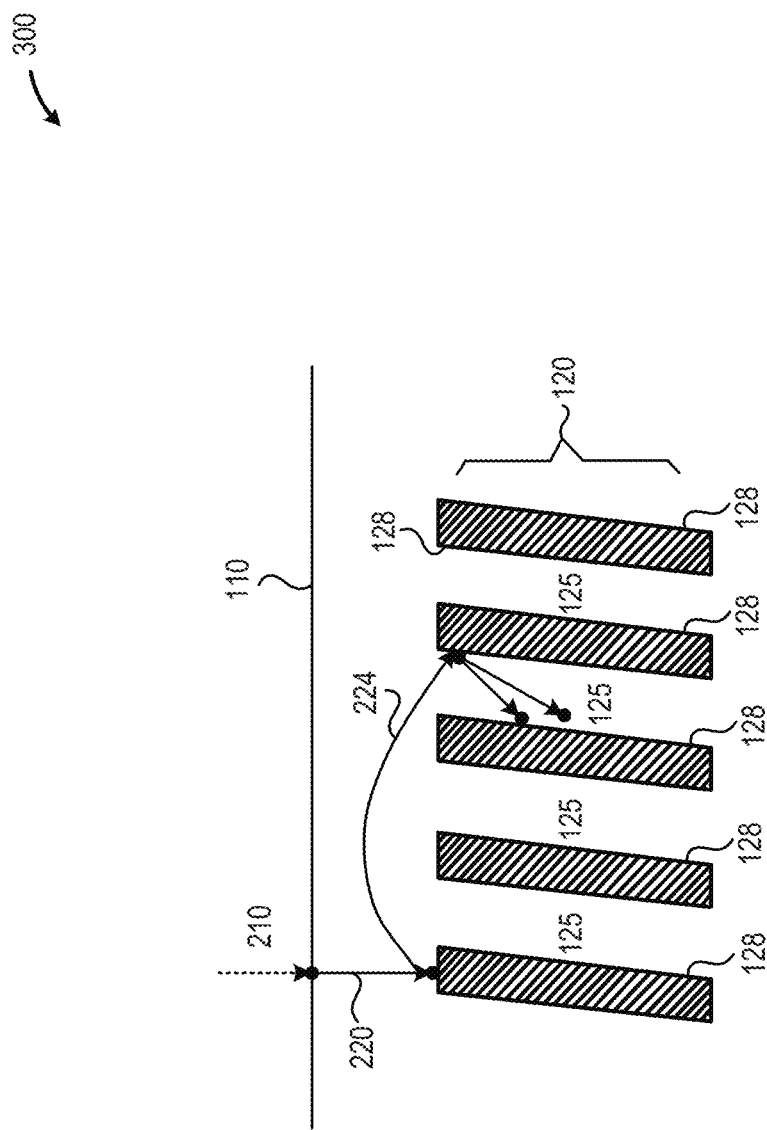
FIG. 3 provides a cross-sectional view of an illustrative image intensifier in which an incoming photon causes the photocathode to emit a photoelectron that impacts the microchannel plate and causes a scattered electron to enter a nearby microchannel, in accordance with at least one embodiment described herein.

FIG. 3 provides a cross-sectional view of an illustrative image intensifier 300 in which an incoming photon 210 causes the photocathode 110 to emit photoelectron 220 that impacts the microchannel plate 120 and causes scattered electron 224 to enter a nearby microchannel 125, in accordance with at least one embodiment described herein. As depicted in FIG. 3, the scattered photoelectron 224 is created due to an absence of the anti-scattering layer 126 on the first surface 121 or first electrode 123 of the microchannel plate 120. The scattered photoelectron 224 may be drawn into a microchannel 125 and impact the high secondary emission surface 128 causing multiple electrons to exit the microchannel plate 120 in the region surrounding the point where the photon 210 initially impacted the photocathode 110.

Deposition of an anti-scattering layer 126 on the first surface 121 or first electrode 123 of the microchannel plate 120 minimizes or even eliminates the scattered electrons 224 caused by photoelectrons 220 that impact the first surface 121. In some implementations, the anti-scattering layer 126 may beneficially absorb or otherwise attenuate the energy of photoelectrons 220 impacting the first surface 121. By absorbing or attenuating the energy of the photoelectrons 220, the incidence of the halo or bloom 244 about bright or luminous objects 242 may be reduced or eliminated. In some implementations, by absorbing or attenuating the energy of the photoelectrons 220 the resolution of the image visible to the system user may be advantageously improved.

FIG. 4A provides a perspective sectional view of an illustrative microchannel plate 120, in accordance with at least one embodiment described herein. As depicted in FIG. 4A, in embodiments, the microchannel plate 120 may include a disk-shaped member having a plurality of microchannels 125 that penetrate from the first surface 121 to the second surface 122. An anti-scattering layer 126 may be disposed across at least a portion of the first surface 121. In embodiments, the microchannel plate 120 may have a diameter 410 of about 50 millimeters (mm) or less; about 70 mm or less; about 90 mm or less; about 110 mm or less; about 130 mm or less; about 150 mm or less; about 200 mm or less; about 250 mm or less; or about 300 mm or less.

FIG. 4B provides a cross-sectional view of an illustrative microchannel 125 such as those found in the illustrative microchannel plate 120 depicted in FIG. 4A, in accordance with at least one embodiment described herein. As depicted in FIG. 4B, voltage source 260 may be conductively coupled to the first electrode 123 disposed in, on, or about the first surface 121 and may be conductively coupled to the second electrode 124 disposed in, on, or about the second surface 122. A photoelectron 220 is shown entering the microchannel 125. The application of a voltage across the microchannel plate 120 creates an electric field through the microchannel 125 that accelerates the photoelectron 220. Within the microchannel 125, the photoelectron 220 impacts the high secondary emission surface 128 within the microchannel 125. The impact of the photoelectron 220 with the high secondary emission surface 128 causes the generation and emission of multiple electrons 230 which are accelerated and exit the microchannel 125.

FIG. 5 provides a cross-sectional view of an illustrative image intensifier 500 in which a first end 512 of a fiber optic bundle 510 is disposed proximate the visible output device 130 and a second end 514 of the fiber optic bundle 510 is disposed proximate an output window 520, in accordance with at least one embodiment described herein. As depicted in FIG. 5, a housing 530 may surround some or all of the photocathode 110, the microchannel plate 120, the visible output device 130, the fiber optic bundle 510, and the output window 520. In some implementations, an external power supply may be coupled to the image intensifier 500 to provide the first voltage 250 and/or the second voltage 260.

The fiber optic bundle 510 carries the visible image produced by a visible output device 130, such as a phosphor screen, to the output window 520. In some implementations, the fiber optic bundle 510 may be twisted such that the image provided by the visible image device 130 is rotated through an angle of about 45° or less; about 90° or less; about 135° or less; or about 180° or less prior to display in the output window 520.

FIG. 6A provides a cross-sectional view of an illustrative microchannel 125 that includes a funnel-shaped entrance, in accordance with at least one embodiment described herein. FIG. 6B provides a cross-sectional view of an illustrative microchannel 125 that includes a square-edged entrance, in accordance with at least one embodiment described herein. Various microchannel throat and/or entrance geometries may be used to maximize the open or collection area of the microchannel plate 120. Furthermore, various microchannel pitch and spacing combinations may be used to maximize the open or collection area of the microchannel plate while maintaining adequate structural integrity within the microchannel plate 120.

Figure 7:
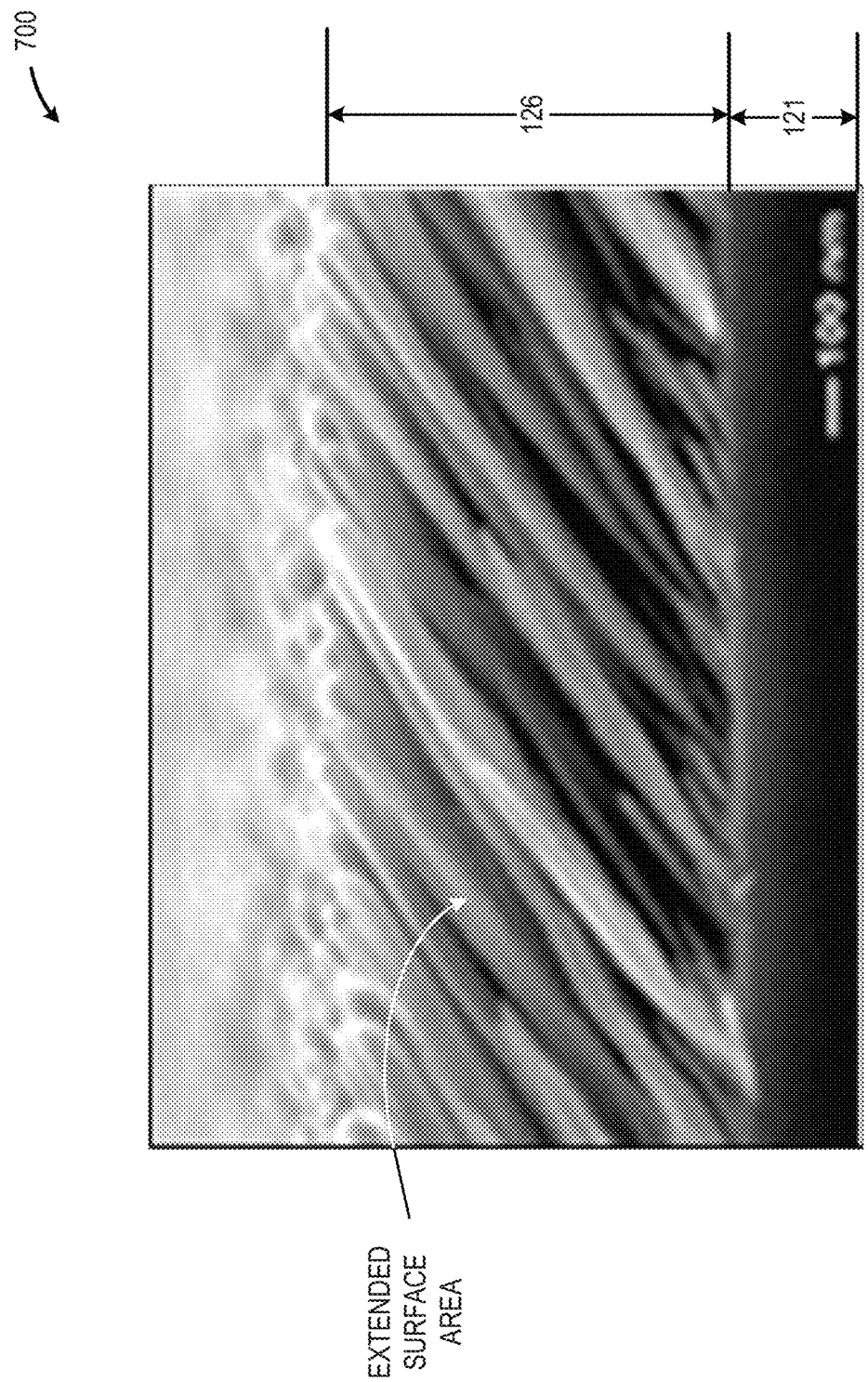
FIG. 7 provides an image of an illustrative anti-scattering layer that includes a columnar growth film that includes structures projecting outwardly from the first surface at an angle of less than 90°, in accordance with at least one embodiment described herein.

In embodiments, such as depicted in FIG. 6B, microchannel 125 wall may form an angle of approximately 90 degrees measured with respect to the first surface 121 of the microchannel plate 120. In other embodiments the tapered or inclined portion of the microchannel 125 wall may form an angle of less than 90 degrees measured with respect to the first surface 121 of the microchannel plate 120. In such embodiments, the microchannel wall 125 may form an angle of from about 30 degrees to about 89 degrees measured with respect to the first surface 121 of the microchannel plate 120. In implementations, the tapered or inclined portion of the microchannel 125 wall may extend into the microchannel 125 for a distance of about 10% to about 75% of the total thickness of the microchannel plate 120. FIG. 7 provides an image of an illustrative anti-scattering layer 126 that includes a columnar growth film that includes structures projecting outwardly from the first surface 121 at an angle of less than 90 degrees, in accordance with at least one embodiment described herein. Evident in FIG. 7 is the relative uniformity in shape and/or height of the structures forming the anti-scattering layer 126.

Figure 8:
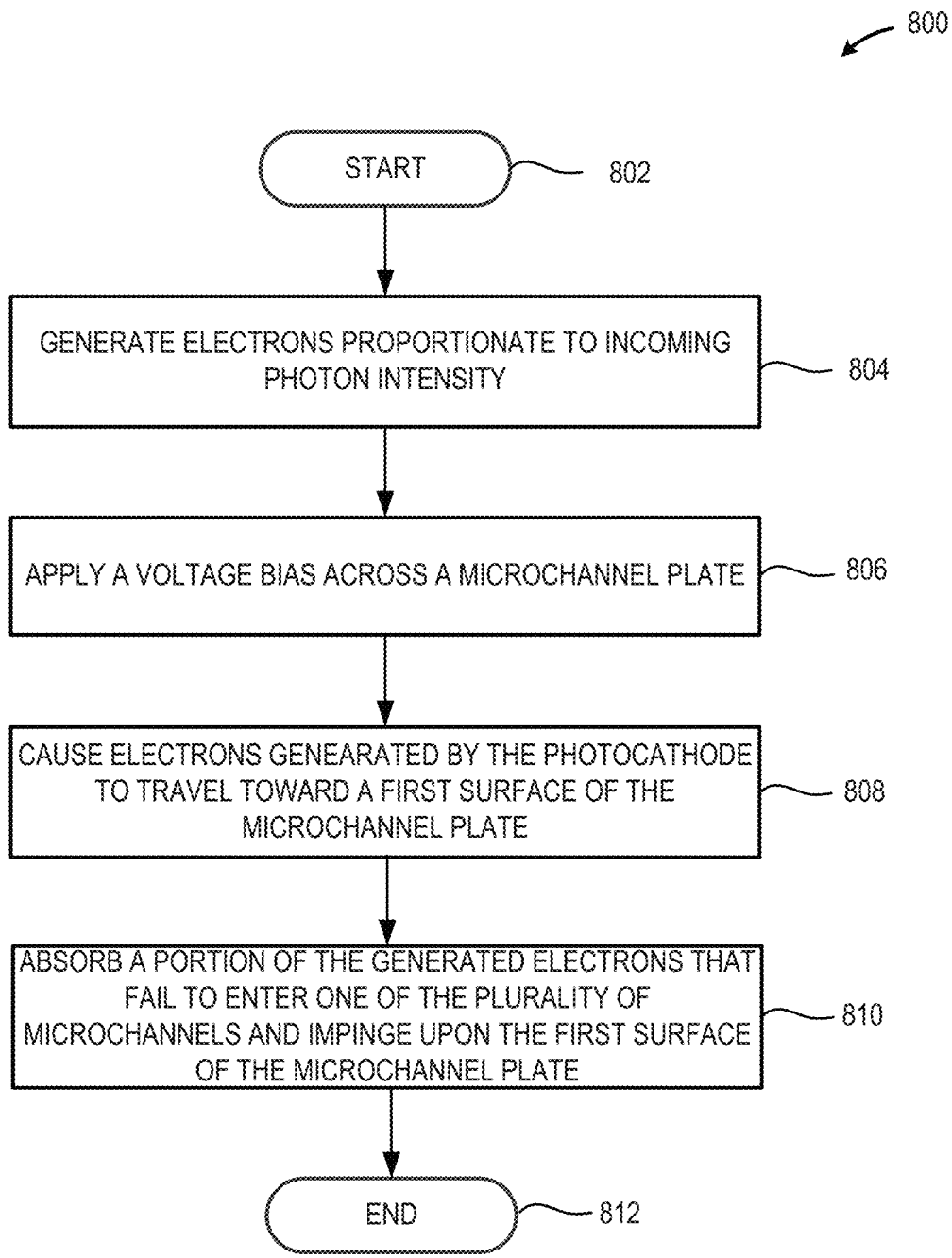
FIG. 8 provides a high level flow diagram of an illustrative image intensification method, in accordance with at least one embodiment described herein.

FIG. 8 provides a high level flow diagram of an illustrative image intensification method 800, in accordance with at least one embodiment described herein. As discussed in detail above, the use of an anti-scattering layer 126 beneficially mitigates or may even eliminate the appearance of a halo or bloom around bright or luminous objects appearing in the field-of-view of an image intensification system 100. The method 800 commences at 802.

At 804, photons 210 striking a photocathode 110 cause the photocathode to generate and emit photoelectrons 220. In implementations, a voltage source 250 may be used to apply a voltage to the photocathode 110. In some implementations, the photocathode 110 may be maintained at a bias voltage measured with respect to the visible output device 130. The photocathode 110 may generate and emit photoelectrons 220 at a rate proportionate to the intensity of the electromagnetic energy (e.g., the visible electromagnetic energy of about 390 nanometers (nm) to about 750 nm and/or near-infrared, or NIR, electromagnetic energy of from about 750 nm to about 1000 nm) incident upon the photocathode 110. Thus, the photocathode 110 may produce photoelectrons 220 at a rate commensurate with the intensity (i.e., the rate/number) of incident photons 210.

At 806, a microchannel plate 120 that includes a plurality of microchannels 125 may be disposed a distance from the photoelectron emitting surface of the photocathode 110. The microchannel plate 120 may include a first electrode 123 disposed in, on, or about a first side 121 of the microchannel plate 120 (facing the photocathode 110) and a second electrode 124 disposed in, on, or about all or a portion of a second side 122 of the microchannel plate 120. In embodiments, a voltage source 260 may be conductively coupled to the first electrode 123 and to the second electrode 124 to apply a differential voltage across the microchannel plate 120. Application of a differential voltage across the microchannel plate 120 causes the electrons generated and emitted by the microchannel plate 120 to accelerate through the microchannels 125.

To minimize the scatter of photoelectrons 220 and resultant degradation of image quality, the microchannel plate 120 may be positioned close to the photocathode 110. However, since the photocathode 110 and the microchannel plate 120 are typically maintained at different potentials, arcing between the photocathode 110 and the microchannel plate 120 may occur. Consequently, positioning the microchannel plate 120 with respect to the photocathode involves balancing minimizing photoelectron deviation with minimizing arcing potential. In some implementations, the distance between the photocathode 110 and the first surface 121 of the microchannel plate 120 may be about: 25 micrometers (μm) or more; about 50 μm or more; about 75 μm or more; about 100 μm or more; about 125 μm or more; or about 150 μm or more.

At 808, the potential difference between the photocathode 110 and the first surface 121 of the microchannel plate 120 creates an electric field in the void space between the photocathode and the microchannel plate 120. The electric field accelerates the photoelectrons 220 emitted by the photocathode 110 toward the first surface 121 of the microchannel plate 120.

At 810, the energy carried by photoelectrons 224 that strike the first surface 121 of the microchannel plate 120 rather than enter a microchannel 125 may be attenuated or absorbed by the anti-scattering layer 126 disposed on the first surface 121 or first electrode 123 of the microchannel plate 120. The attenuation of the photoelectrons 220 by the anti-scattering layer 126 beneficially minimizes or even eliminates the scattering of electrons into nearby microchannels 125. Minimizing electron scattering across the microchannel plate 120, in turn, advantageously minimizes the appearance of "bloom" or "halo" in the image displayed to the system user. The method 800 concludes at 812.

Figure 9:
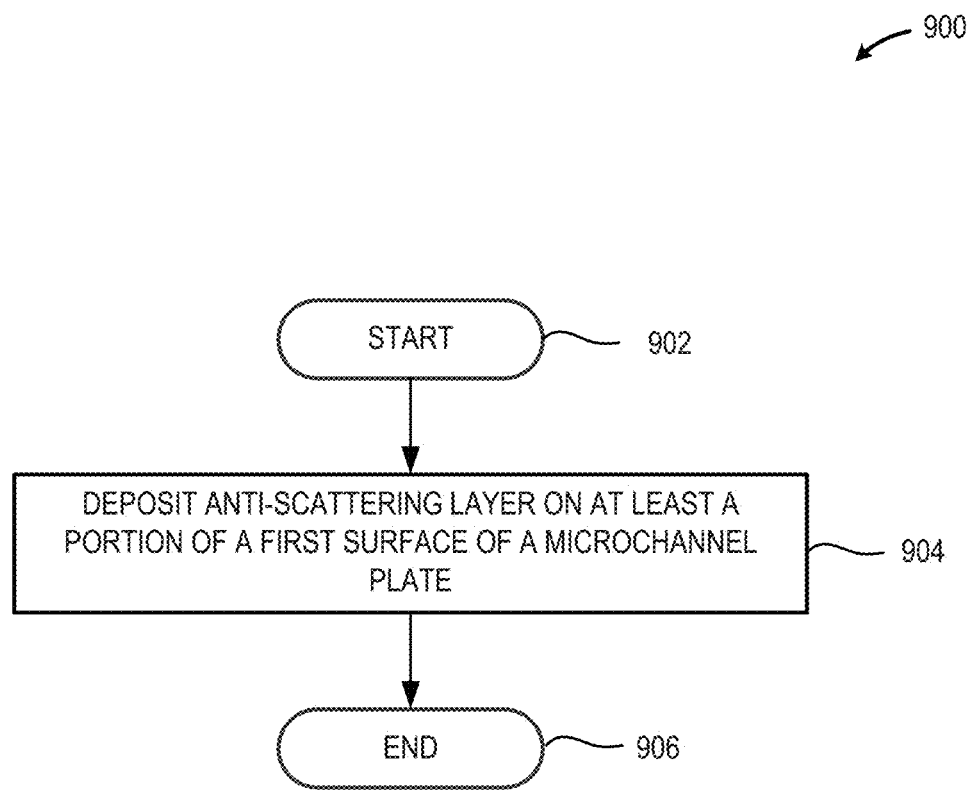
FIG. 9 provides a high-level flow diagram of an illustrative method for minimizing electron scatter across a microchannel plate in an image intensifier, in accordance with at least one embodiment described herein.

FIG. 9 provides a high-level flow diagram of an illustrative method 900 for minimizing electron scatter across a microchannel plate 120 in an image intensifier 100, in accordance with at least one embodiment described herein. The appearance of "halo" or "bloom" in an image provided by the image intensifier 100 is caused by electron scattering across the microchannel plate 120. Such effects typically occur about bright or highly luminous objects within the field-of-view of the image intensifier 100. Minimizing, mitigating, or eliminating such electron scattering reduces the appearance of "halo" or "bloom" in the output image. The method 900 commences at 902.

At 904, an anti-scattering layer 126 is deposited across all or a portion of the first surface 121 or first electrode 123 of the microchannel plate 120. In some implementations the first surface 121 may include some or all of the "web" portion between each of the plurality of microchannels 125 forming the microchannel plate 120. In some implementations, the anti-scattering layer 126 may extend at least partially into the entrance of some or all of the microchannels 125. For example, the anti-scattering layer 126 may extend into the entrance of some or all of the microchannels a distance of: about 5% or less of the length of the microchannel 125; about 10% or less of the length of the microchannel 125; about 15% or less of the length of the microchannel 125; about 20% or less of the length of the microchannel 125; about 25% or less of the length of the microchannel 125; or about 50% or less of the length of the microchannel 125.

The anti-scattering layer 126 may be deposited in, on, or about the first electrode 123 such that the first electrode 123 is disposed between the anti-scattering layer 126 and the first surface 121 of the microchannel plate 120. The anti-scattering layer 126 may be deposited using any currently available or future developed deposition technique including, but not limited to: ion assist, electron beam, laser ablation, sputtering, and resistance evaporation. In some implementations, once applied, the anti-scattering layer 126 may be subject to one or more secondary or post-application treatment processes, such as one or more secondary processes that increase the work function of all or a portion of the materials used in the anti-scattering layer 126. The anti-scattering layer 126 may have a constant film thickness across the microchannel plate 120. For example, the anti-scattering layer 126 may have a thickness of: about 1000 nanometers (nm) or less; about 700 nm or less; about 500 nm or less; about 300 nm or less; about 150 nm or less; about 100 nm or less; about 50 nm or less; about 200 nm or less; or about 10 nm or less.

In at least one embodiment, the anti-scattering layer 126 may include low density, aligned, columnar structures produced using a glancing angle deposition technique. In such an embodiment, the anti-scattering layer 126 may be similar in appearance to the anti-scattering layer 126 depicted in FIG. 7. The anti-scattering layer 126 may include one or more materials capable of absorbing photoelectrons 220 emitted by the photocathode 110 and/or attenuating the energy of the photoelectrons 220 emitted by the photocathode 110. Such materials may include, but are not limited to: boron, nickel, chrome, copper, titanium, boron carbides, nickel carbides, chrome carbides, copper carbides, titanium carbides, boron oxides, nickel oxides, chrome oxides, copper oxides, titanium oxides, boron containing alloys, nickel containing alloys, chrome containing alloys, copper containing alloys, titanium containing alloys, or combinations thereof. The method 900 concludes at 906.

Additionally, operations for the embodiments have been further described with reference to the above figures and accompanying examples. Some of the figures may include one or more flow diagrams. Although such figures presented herein may include a particular sequence, it can be appreciated that the illustrated sequence merely provides an example of how the general functionality described herein can be implemented. Further, the given sequence does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment" or "an embodiment" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

According to example 1, there is provided a reduced bloom effect image intensifier. The image intensifier may include: a photocathode; a phosphor screen; a microchannel plate disposed between the photocathode and the phosphor screen, the microchannel plate having a first surface oriented toward the photocathode, a transversely opposed second surface oriented toward the phosphor screen, and a plurality of microchannels fluidly coupling the first surface and the second surface, the microchannel plate including: an anti-scattering layer, the anti-scattering layer may be deposited across at least a portion of the first surface and/or the input electrode and may extend a distance into each of the plurality of microchannels, wherein the anti-scattering layer includes at least one low-Z material.

Example 2 may include elements of example 1 and may additionally include an input electrode disposed across at least a portion of the first surface between the first surface and the and anti-scattering layer.

Example 3 may include elements of example 2 and may additionally include an output electrode disposed across at least a portion of the second surface and oriented toward the phosphor screen.

Example 4 may include elements of example 3 and may additionally include a high secondary emission surface disposed across at least a portion of an exposed surface in each of the plurality of microchannels.

Example 5 may include elements of any examples 1 through 4 where the at least one low-Z material comprises at least one of: boron, nickel, chrome, copper, and titanium.

Example 6 may include elements of example 5 where the anti-scattering layer may include an anti-scattering layer having a thickness of from about 10 nanometers to about 1000 nanometers.

Example 7 may include elements of example 6 where the anti-scattering layer may include an anti-scattering layer having an extended surface area.

Example 8 may include elements of example 7 where the anti-scattering layer may include an extended surface area that includes low-density, aligned, columnar structures.

Example 9 may include elements of example 5 and may additionally include a fiber optic bundle having a first end and a second end, the first end disposed proximate the phosphor screen and the second end disposed proximate an output window.

Example 10 may include elements of example 9 where the second end of the fiber optic bundle is rotated 180 degrees about an optical axis of the image intensifier such that an image provided by the phosphor screen is inverted when viewed at the output window.

According to example 11, there is provided a method of reducing bloom effect in an image intensifier. The method may include generating electrons proportionate to incoming photon intensity via a photocathode; applying a voltage bias across a microchannel plate that includes a plurality of microchannels using a first electrode disposed on a first surface of the microchannel plate and a second electrode disposed on a second surface of the microchannel plate, the second surface transversely opposed to the first surface; causing the electrons generated by the photocathode to travel toward the first surface of the microchannel plate; and absorbing, via an anti-scattering layer disposed on at least a portion of the first surface of the microchannel plate, a portion of the generated electrons that fail to enter one of the plurality of microchannels and impinge upon the first surface of the microchannel plate.

Example 12 may include elements of example 11 and may additionally include multiplying at least a portion of the generated electrons using a high secondary emission surface disposed inside each of the plurality of microchannels.

Example 13 may include elements of example 12 and may additionally include converting at least a portion of the multiplied electrons into a visible image using a phosphor screen disposed a distance from the microchannel plate.

According to example 14, there is provided a method of manufacturing reduced bloom effect image intensifier. The method may include: depositing an anti-scattering layer that includes at least one low-Z material on at least a portion of a first surface of a microchannel plate, the microchannel plate including a plurality of microchannels fluidly coupling the first surface to a transversely opposed second surface, the anti-scattering layer to absorb at least a portion of electrons incident upon the first surface.

Example 15 may include elements of example 14 and may additionally include disposing a photocathode a first distance from the first surface of the microchannel plate.

Example 16 may include elements of example 15 and may additionally include disposing a phosphor screen a second distance from the second surface of the microchannel plate.

Example 17 may include elements of example 16 and may include disposing a first electrode proximate the first surface of the microchannel plate, the first electrode positioned between the anti-scattering layer and the first surface of the microchannel plate; and disposing a second electrode proximate the second surface of the microchannel plate.

Example 18 may include elements of claim 17 and may additionally include conductively coupling a power supply to the first electrode and second electrode, the power supply to, when in operation, apply a bias voltage across the microchannel plate.

Example 19 may include elements of example 16 and may additionally include disposing a first end of a fiber optic bundle proximate the phosphor screen; and disposing a second end of a fiber optic bundle proximate an output window.

Example 20 may include elements of example 19 and may additionally include rotating the second end of the fiber optic bundle through an angle of 180 degrees measured with respect to the first end of the fiber optic bundle.

Example 21 may include elements of any of examples 14 through 20 where depositing an anti-scattering layer that includes at least one low-Z material on at least a portion of a first surface of a microchannel plate may include: depositing an anti-scattering layer that includes at least one low-Z material on at least a portion of a first surface of a microchannel plate, the anti-scattering layer having a thickness of from about 10 nanometers to about 1000 nanometers.

Example 22 may include elements of example 21 where depositing an anti-scattering layer that includes at least one low-Z material on at least a portion of a first surface of a microchannel plate may include: depositing an anti-scattering layer that includes at least one of: boron; nickel; chrome; copper titanium; an oxide containing boron, nickel, chrome, copper, or titanium; or, a carbide containing boron, nickel, chrome, copper, or titanium on at least a portion of the first surface of the microchannel plate.

Example 23 may include elements of example 21 where depositing an anti-scattering layer that includes at least one low-Z material on at least a portion of a first surface of a microchannel plate may include: depositing an anti-scattering layer that includes at least one low-Z material on at least a portion of a first surface of a microchannel plate via physical vapor deposition.

Example 24 may include elements of example 23 where depositing an anti-scattering layer that includes at least one low-Z material on at least a portion of a first surface of a microchannel plate via physical vapor deposition may include: depositing an anti-scattering layer that includes at least one low-Z material on at least a portion of a first surface of a microchannel plate via at least one of ion assist, E-beam, laser ablation, sputtering, or resistance evaporation.

Example 25 may include elements of example 21 where depositing an anti-scattering layer that includes at least one low-Z material on at least a portion of a first surface of a microchannel plate may include: depositing an anti-scattering layer that includes at least one low-Z material having an extended surface area on at least a portion of a first surface of a microchannel plate via physical vapor deposition.

Example 26 may include elements of example 25 where depositing an anti-scattering layer that includes at least one low-Z material having an extended surface area on at least a portion of a first surface of a microchannel plate may include: depositing an anti-scattering layer that includes at least one low-Z material having an extended surface area that includes low-density, aligned, columnar structures.

Example 27 may include elements of example 26 where depositing an anti-scattering layer that includes at least one low-Z material having an extended surface area that includes low-density, aligned, columnar structures may include: depositing an anti-scattering layer that includes at least one low-Z material having an extended surface area that includes low-density, aligned, columnar structures formed using at least one of: a glancing angle approach or a post-production oxidation.

According to example 28, there is provided a system for reducing bloom effect in an image intensifier, comprising: a means for generating electrons proportionate to incoming photon intensity; a means for applying a voltage bias across a microchannel plate that includes a plurality of microchannels using a first electrode disposed on a first surface of the microchannel plate and a second electrode disposed on a second surface of the microchannel plate, the second surface transversely opposed to the first surface; a means for causing the electrons generated by the photocathode to travel toward the first surface of the microchannel plate; and a means for absorbing a portion of the generated electrons that fail to enter one of the plurality of microchannels and impinge upon the first surface of the microchannel plate.

Example 29 may include elements of example 28 and may additionally include a means for multiplying at least a portion of the generated electrons using a high secondary emission surface disposed inside each of the plurality of microchannels.

Example 30 may include elements of example 29 and may additionally include a means for converting at least a portion of the multiplied electrons into a visible image using a phosphor screen disposed a distance from the microchannel plate.

According to example 31, there is provided a system of manufacturing reduced bloom effect image intensifier. The method may include: a means for depositing an anti-scattering layer that includes at least one low-Z material on at least a portion of a first surface of a microchannel plate, the microchannel plate including a plurality of microchannels fluidly coupling the first surface to a transversely opposed second surface, the anti-scattering layer to absorb at least a portion of electrons incident upon the first surface.

Example 32 may include elements of example 31 and may additionally include a means for disposing a first electrode proximate the first surface of the microchannel plate, the first electrode positioned between the anti-scattering layer and the first surface of the microchannel plate; and a means for disposing a second electrode proximate the second surface of the microchannel plate.

Example 33 may include elements of example 32 and may additionally include a means for conductively coupling a power supply to the first electrode and second electrode, the power supply to, when in operation, apply a bias voltage across the microchannel plate.

Example 34 may include elements of example 31 and may additionally include a means for disposing a first end of a fiber optic bundle proximate a phosphor screen disposed a distance from the second surface of the microchannel plate; and a means for disposing a second end of a fiber optic bundle proximate an output window.

Example 35 may include elements of example 34 and may additionally include a means for rotating the second end of the fiber optic bundle through an angle of 180 degrees measured with respect to the first end of the fiber optic bundle.

Example 36 may include elements of any of examples 31 through 35 where the means for depositing an anti-scattering layer that includes at least one low-Z material on at least a portion of a first surface of a microchannel plate may include: a means for depositing an anti-scattering layer that includes at least one low-Z material on at least a portion of a first surface of a microchannel plate, the anti-scattering layer having a thickness of from about 10 nanometers to about 1000 nanometers.

Example 37 may include elements of example 36 where the means for depositing an anti-scattering layer that includes at least one low-Z material on at least a portion of a first surface of a microchannel plate may include: a means for depositing an anti-scattering layer that includes at least one of: boron; nickel; chrome; copper titanium; an oxide containing boron, nickel, chrome, copper, or titanium; or; a carbide containing boron, nickel, chrome, copper, or titanium on at least a portion of the first surface of the microchannel plate.

Example 38 may include elements of example 36 where the means for depositing an anti-scattering layer that includes at least one low-Z material on at least a portion of a first surface of a microchannel plate may include: a means for depositing an anti-scattering layer that includes at least one low-Z material on at least a portion of a first surface of a microchannel plate via physical vapor deposition.

Example 39 may include elements of example 38 where the means for depositing an anti-scattering layer that includes at least one low-Z material on at least a portion of a first surface of a microchannel plate via physical vapor deposition may include: a means for depositing an anti-scattering layer that includes at least one low-Z material on at least a portion of a first surface of a microchannel plate via at least one of ion assist, E-beam, laser ablation, sputtering, or resistance evaporation.

Example 40 may include elements of example 36 where the means for depositing an anti-scattering layer that includes at least one low-Z material on at least a portion of a first surface of a microchannel plate may include: a means for depositing an anti-scattering layer that includes at least one low-Z material having an extended surface area on at least a portion of a first surface of a microchannel plate via physical vapor deposition.

Example 41 may include elements of example 40 where the means for depositing an anti-scattering layer that includes at least one low-Z material having an extended surface area on at least a portion of a first surface of a microchannel plate may include: a means for depositing an anti-scattering layer that includes at least one low-Z material having an extended surface area that includes low-density, aligned, columnar structures.

Example 42 may include elements of example 41 where the means for depositing an anti-scattering layer that includes at least one low-Z material having an extended surface area that includes low-density, aligned, columnar structures may include: a means for depositing an anti-scattering layer that includes at least one low-Z material having an extended surface area that includes low-density, aligned, columnar structures formed using at least one of: a glancing angle approach or a post-production oxidation.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:
1. A reduced bloom effect image intensifier, comprising:
 a photocathode to generate electrons in response to incident electromagnetic energy;
 a phosphor screen;
 a microchannel plate disposed between the photocathode and the phosphor screen, the microchannel plate having a first surface oriented toward the photocathode, a transversely opposed second surface oriented toward the phosphor screen, and a plurality of microchannels fluidly coupling the first surface and the second surface, the microchannel plate including:

an anti-scattering layer, the anti-scattering layer deposited across at least a portion of the first surface of the microchannel plate and extending a distance inside an entrance of each of the plurality of microchannels such that at least a portion of the entrance to the respective microchannel remains unobstructed;

wherein the anti-scattering layer includes at least one low-Z material that forms electron absorbing structures projecting from the first surface to provide an extended surface area to capture at least a portion of the electrons that fail to enter one of the plurality of microchannels.

2. The image intensifier of claim 1, further comprising an input electrode disposed across at least a portion of the first surface between the first surface and the and anti-scattering layer.

3. The image intensifier of claim 2, further comprising an output electrode disposed across at least a portion of the second surface and oriented toward the phosphor screen.

4. The image intensifier of claim 3, further comprising a high secondary emission surface disposed across at least a portion of an exposed surface in each of the plurality of microchannels.

5. The image intensifier of claim 1 wherein the at least one low-Z material comprises at least one of: boron, nickel, chrome, copper, and titanium.

6. The image intensifier of claim 5 wherein the anti-scattering layer comprises an anti-scattering layer having a thickness of from about 10 nanometers to about 1000 nanometers.

7. The image intensifier of claim 1 wherein the extended surface area includes a plurality of low-density, aligned, columnar structures.

8. The image intensifier of claim 5, further comprising:
a fiber optic bundle having a first end and a second end, the first end disposed proximate the phosphor screen and the second end disposed proximate an output window.

9. The image intensifier of claim 8 wherein the second end of the fiber optic bundle is rotated 180 degrees about an optical axis of the image intensifier such that an image provided by the phosphor screen is inverted when viewed at the output window.

10. A method of reducing bloom effect in an image intensifier, comprising:
generating electrons proportionate to incoming photon intensity via a photocathode;
applying a voltage bias across a microchannel plate that includes a plurality of microchannels using a first electrode disposed on a first surface of the microchannel plate and a second electrode disposed on a second surface of the microchannel plate, the second surface transversely opposed to the first surface;
causing the electrons generated by the photocathode to travel toward the first surface of the microchannel plate; and
absorbing, via an anti-scattering layer deposited on at least a portion of the first surface of the microchannel plate and extending a distance inside an entrance of each of the plurality of microchannels such that at least a portion of the entrance to the respective microchannel remains unobstructed, a portion of the generated electrons that fail to enter one of the plurality of microchannels;
wherein the anti-scattering layer includes at least one low-Z material that forms electron absorbing structures that project from the first surface to provide an extended surface area to capture at least a portion of the electrons that fail to enter one of the plurality of microchannels.

11. The method of claim 10, further comprising:
multiplying at least a portion of the generated electrons using a high secondary emission surface disposed inside each of the plurality of microchannels.

12. The method of claim 11, further comprising:
converting at least a portion of the multiplied electrons into a visible image using a phosphor screen disposed a distance from the microchannel plate.

13. A method of manufacturing reduced bloom effect image intensifier, the method comprising:
depositing an anti-scattering layer that includes at least one low-Z material on at least a portion of a first surface of a microchannel plate, the microchannel plate including a plurality of microchannels fluidly coupling the first surface to a transversely opposed second surface, the anti-scattering layer to absorb at least a portion of electrons incident upon the first surface, the anti-scattering layer extending a distance inside an entrance of each of the plurality of microchannels such that at least a portion of the entrance to the respective microchannel remains unobstructed;
wherein the at least one low-Z material forms electron absorbing structures projecting from the first surface to provide an extended surface area to capture at least a portion of the electrons that fail to enter one of the plurality of microchannels.

14. The method of claim 13, further comprising:
disposing a photocathode a first distance from the first surface of the microchannel plate.

15. The method of claim 14, further comprising:
disposing a phosphor screen a second distance from the second surface of the microchannel plate.

16. The method of claim 15, further comprising:
disposing a first electrode proximate the first surface of the microchannel plate, the first electrode positioned between the anti-scattering layer and the first surface of the microchannel plate; and
disposing a second electrode proximate the second surface of the microchannel plate.

17. The method of claim 16, further comprising:
conductively coupling a power supply to the first electrode and second electrode, the power supply to, when in operation, apply a bias voltage across the microchannel plate.

18. The method of claim 15, further comprising:
disposing a first end of a fiber optic bundle proximate the phosphor screen; and
disposing a second end of a fiber optic bundle proximate an output window.

19. The method of claim 18, further comprising:
rotating the second end of the fiber optic bundle through an angle of about 180 degrees measured with respect to the first end of the fiber optic bundle.

20. The method of claim 13 wherein depositing an anti-scattering layer that includes at least one low-Z material on at least a portion of a first surface of a microchannel plate comprises:
depositing an anti-scattering layer that includes at least one low-Z material on at least a portion of a first surface of a microchannel plate, the anti-scattering layer having a thickness of from about 10 nanometers to about 1000 nanometers.

21. The method of claim 20 wherein depositing an anti-scattering layer that includes at least one low-Z material on at least a portion of a first surface of a microchannel plate comprises:

depositing an anti-scattering layer that includes at least one of: boron; nickel; chrome; copper titanium; an oxide containing boron, nickel, chrome, copper, or titanium; or; a carbide containing boron, nickel, chrome, copper, or titanium on at least a portion of the first surface of the microchannel plate.

22. The method of claim 20 wherein depositing an anti-scattering layer that includes at least one low-Z material on at least a portion of a first surface of a microchannel plate comprises:

depositing an anti-scattering layer that includes at least one low-Z material on at least a portion of a first surface of a microchannel plate via physical vapor deposition.

23. The method of claim 22 wherein depositing an anti-scattering layer that includes at least one low-Z material on at least a portion of a first surface of a microchannel plate via physical vapor deposition comprises:

depositing an anti-scattering layer that includes at least one low-Z material on at least a portion of a first surface of a microchannel plate via at least one of ion assist, E-beam, laser ablation, sputtering, or resistance evaporation.

24. The method of claim 20 wherein depositing an anti-scattering layer that includes at least one low-Z material on at least a portion of a first surface of a microchannel plate comprises:

depositing an anti-scattering layer that includes at least one low-Z material having an extended surface area on at least a portion of a first surface of a microchannel plate via physical vapor deposition.

25. The method of claim 24 wherein depositing an anti-scattering layer that includes at least one low-Z material having an extended surface area on at least a portion of a first surface of a microchannel plate comprises:

depositing an anti-scattering layer that includes at least one low-Z material in which the extended surface area includes a plurality of low-density, aligned, columnar structures.

26. The method of claim 25 wherein depositing an anti-scattering layer that includes at least one low-Z material in which the extended surface area includes the plurality of low-density, aligned, columnar structures comprises:

depositing an anti-scattering layer that includes at least one low-Z material in which the extended surface area includes the plurality of low-density, aligned, columnar structures, each of the plurality of low-density, aligned, columnar structures formed using at least one of: a glancing angle approach or a post-production oxidation.

* * * * *